(12) United States Patent
Hsieh et al.

(10) Patent No.: US 8,299,508 B2
(45) Date of Patent: Oct. 30, 2012

(54) CMOS STRUCTURE WITH MULTIPLE SPACERS

(75) Inventors: Bor Chiuan Hsieh, Taoyuan (TW);
Han-Ping Chung, Fongshan (TW);
Chih-Hsin Ko, Fongshan (TW);
Bor-Wen Chan, Hsinchu (TW);
Hun-Jan Tao, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 279 days.

(21) Appl. No.: 12/757,517

(22) Filed: Apr. 9, 2010

(65) Prior Publication Data

US 2011/0031538 A1 Feb. 10, 2011

Related U.S. Application Data

(60) Provisional application No. 61/232,216, filed on Aug. 7, 2009.

(51) Int. Cl.
*H01L 29/78* (2006.01)
*H01L 21/8234* (2006.01)
*H01L 21/8238* (2006.01)

(52) U.S. Cl. . 257/288; 257/408; 257/900; 257/E29.255; 257/E29.266; 257/E21.64; 257/E21.626

(58) Field of Classification Search .......... 257/288, 257/408, E21.626, E21.64, E29.266, E29.255, 257/900
See application file for complete search history.

(56) References Cited

U.S. PATENT DOCUMENTS

| | | | | |
|---|---|---|---|---|
| 6,720,213 | B1 * | 4/2004 | Gambino et al. | 438/184 |
| 7,439,124 | B2 * | 10/2008 | Fukai et al. | 438/231 |
| 7,868,386 | B2 * | 1/2011 | Thei et al. | 257/344 |
| 2007/0090462 | A1 * | 4/2007 | Wu et al. | 257/369 |
| 2008/0001191 | A1 * | 1/2008 | Pruefer et al. | 257/288 |
| 2008/0093666 | A1 * | 4/2008 | Okayama | 257/338 |
| 2011/0175148 | A1 * | 7/2011 | Yan et al. | 257/288 |
| 2011/0316089 | A1 * | 12/2011 | Pacheco Rotondaro et al. | 257/369 |
| 2012/0025329 | A1 * | 2/2012 | Wu et al. | 257/411 |

* cited by examiner

*Primary Examiner* — Victor A Mandala
(74) *Attorney, Agent, or Firm* — Lowe Hauptman Ham & Berner, LLP

(57) ABSTRACT

A semiconductor device includes a substrate having shallow trench isolation and source/drain regions located therein, a gate stack located on the substrate between the source/drain regions, a first gate spacer on the sidewall of the gate stack, and a second gate spacer on the sidewall of the first gate spacer.

20 Claims, 5 Drawing Sheets

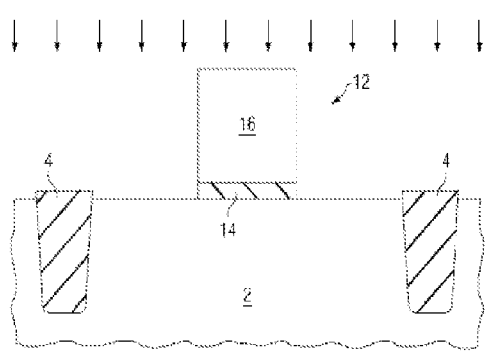
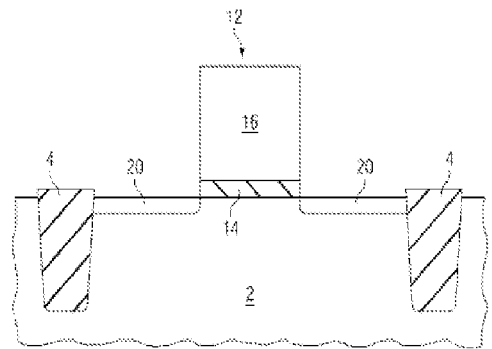
FIG. 1                                      FIG. 2

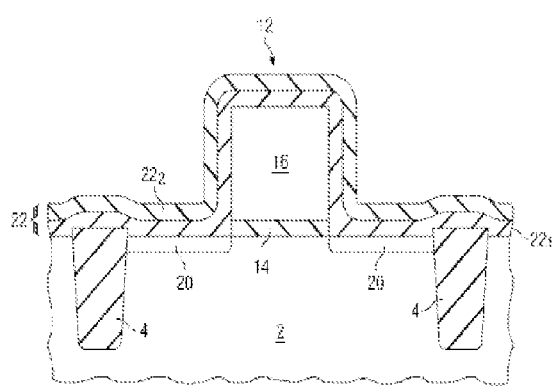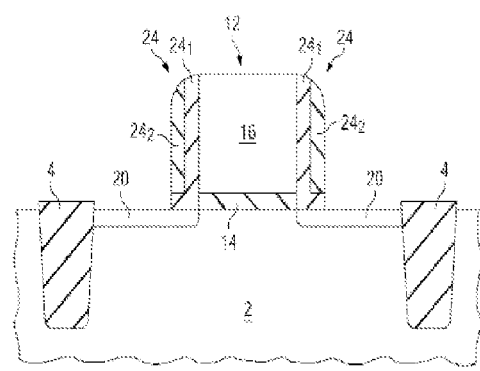
FIG. 3
FIG. 4

CMOS STRUCTURE WITH MULTIPLE SPACERS

CROSS-REFERENCE TO RELATED APPLICATIONS

The present application claims priority of U.S. Provisional Patent Application Ser. No. 61/232,216, filed on Aug. 7, 2009, which is incorporated herein by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices. CMOS devices have typically a transistor established by forming a gate electrode on a silicon substrate, and then forming a source region and a drain region side by side in the substrate beneath the gate electrode by implanting appropriate dopant materials into the areas of the substrate that are to become the source and drain regions. The gate is insulated from the source and drain regions by a thin gate oxide layer. This generally-described structure cooperates to function as a transistor.

To facilitate cooperation between the gate and the source and drain regions, most of the source and drain regions do not lie directly under the gate. However, a small part of the source region does overlap the gate, and likewise a small part of the drain region extends directly under the gate. These small parts of the source and drain regions that overlap the gate are respectively referred to as the lightly doped source/drain (LDD) regions.

While the LDD regions enhance the coupling between the gate and the channel that is established by the source and drain regions, the so-called "fringe" capacitive coupling is also induced between the gate and the LDD regions. Such fringe coupling degrades the performance of the transistor in alternating current (AC) applications. The importance of this consideration grows as the size of the transistors is reduced by ULSI technology, because while the overall dimensions of the transistors are smaller, the amount by which the LDD regions overlap the gate have heretofore remained unchanged. Accordingly, the undesirable effects of fringe capacitive coupling between the gate and the LDD regions are magnified in very small transistors.

One approach to the above-noted problem would be to reduce the dielectric constant of gate spacers, hence, reduce the capacitive coupling between the LDD regions and the gate.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

FIGS. 1 through 7 are sectional views of a semiconductor device during various fabrication stages.

DETAILED DESCRIPTION

Figure 5:
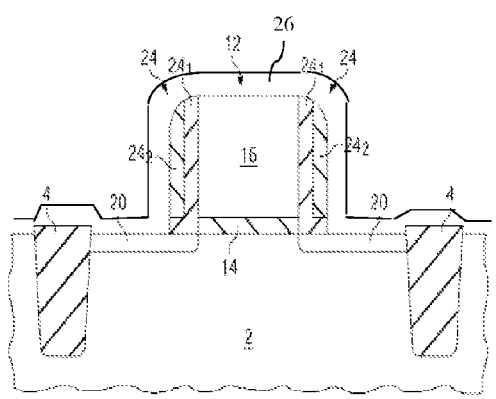

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 8:
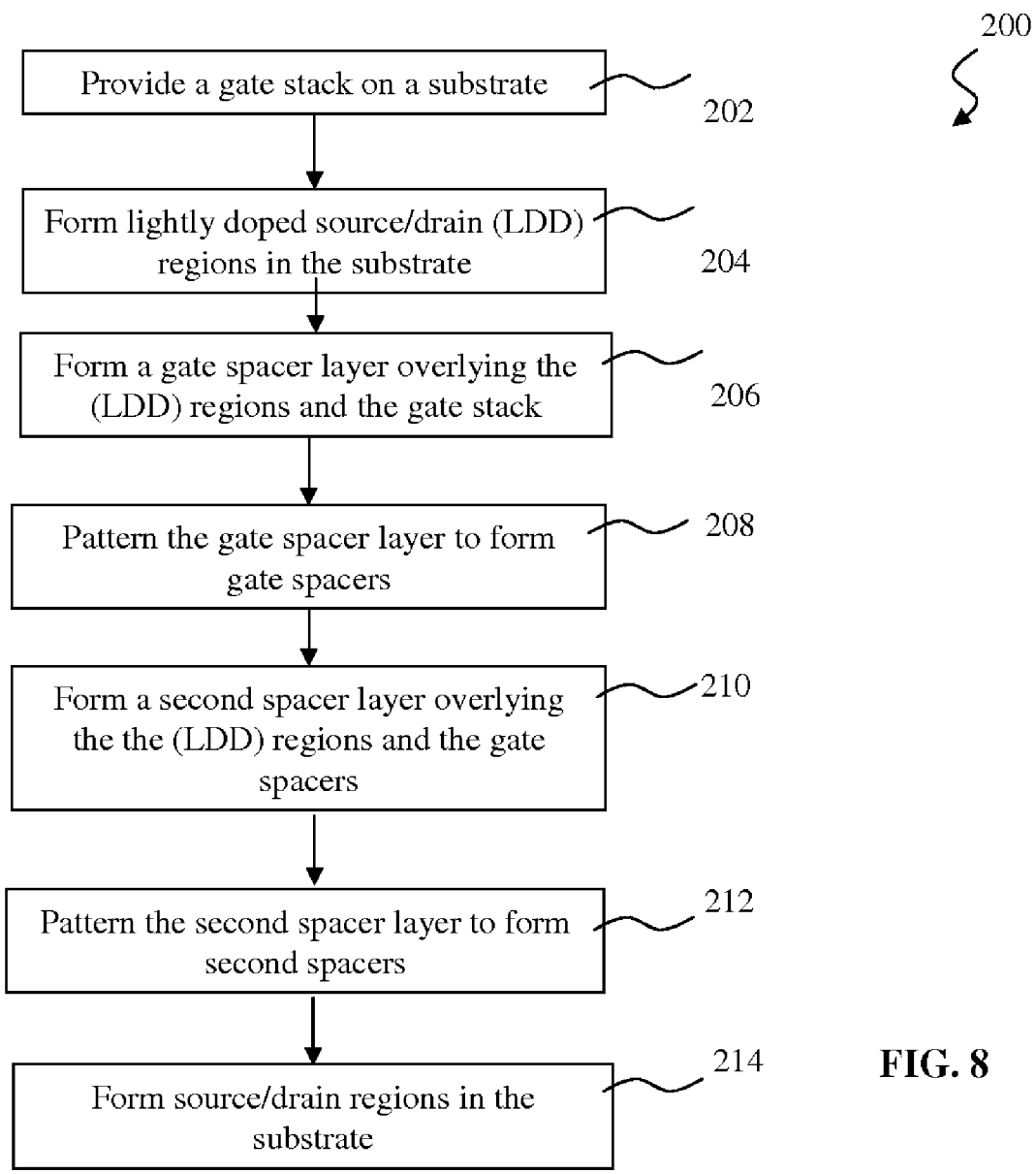
FIG. 8 is a flowchart showing one embodiment of a method for forming a semiconductor device.

Referring to FIGS. 1 and 8, the method 200 may begin at step 202 by providing a gate stack 12 on a substrate 2. Preferably, the substrate 2 comprises bulk silicon. Alternatively, substrate 2 comprises bulk SiGe or other semiconductor materials. Substrate 2 may also have a composite structure such as silicon on insulator (SOI). Shallow trench isolation (STI) regions 4 are formed in the substrate 2 for isolating active regions in the substrate 2 as is known in the art. The isolation structure may be formed of silicon oxide, silicon nitride, silicon oxynitride, fluoride-doped silicate (FSG), and/or a low k dielectric material known in the art. As is known in the art, STI regions 4 may be formed by etching recesses in the substrate 2, and then filling the recesses with dielectric materials.

The gate stack 12, comprising a gate dielectric 14 including an interfacial layer/high-k dielectric layer (not shown) formed over the substrate 2. The interfacial layer may include a silicon oxide layer having a thickness ranging from about 5 to about 10 angstrom (A) formed on the substrate 2. The high-k dielectric layer may be formed on the interfacial layer by atomic layer deposition (ALD) or other suitable technique. The high-k dielectric layer may include a thickness ranging from about 10 to about 40 angstrom (A). The high-k dielectric layer may include hafnium oxide ($HfO_2$). Alternatively, the high-k dielectric layer may optionally include other high-k dielectrics such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof.

The gate stack 12 also comprises a gate electrode 16 formed over the gate dielectric 14. The gate electrode 16 may include doped polysilicon, metal, metal silicide, metal nitride, and combinations thereof. The metal gate electrode may include a thickness ranging from about 10 to about 200 angstrom (A). The gate electrode 16 may be formed with metal by various deposition techniques such as chemical vapor deposition (CVD), physical vapor deposition (PVD or sputtering), plating, or other suitable technique. The metal gate electrode may include TiN, TaN, $ZrSi_2$, $MoSi_2$, $TaSi_2$, $NiSi_2$, WN, or other suitable material.

As is known in the art, the gate dielectric 14 and the gate electrode 16 may be patterned to form the gate stack 12. The formation process may further include a hard mask (not shown) formed over the gate electrode 16. The hard mask may be formed by a deposition process or other suitable processes. The hard mask may include silicon nitride, silicon oxynitride, silicon carbide, or other suitable material. A patterned photoresist layer (not shown) may be formed by a photolithography process for gate patterning. The photolithography process may include spin coating, soft-baking, exposure, post-baking, developing, rinsing, drying, and other suitable processes. Alternatively, the patterning may be performed by immersion lithography, electron beam lithography, or other suitable processes. A first etch process may be performed to pattern the hard mask, and the patterned hard mask may be used as a mask for etching (a second etch process) the gate dielectric 14 and the gate electrode 16 to form the gate stack 12. The second etch process may include a dry or wet etch process. Also, the second etch process may have a high selectivity such that the etch process may stop at the substrate 2. The patterned photoresist layer and hard mask may be removed by stripping or other suitable processes.

Still referring to FIG. 1, an optional pre-amorphized implantation (PAI), as symbolized by arrows, is performed to reduce the dopant channeling effect and enhance dopant activation. In the preferred embodiment, silicon, germanium and/or carbon are implanted. In other embodiments, inert gases, such as neon, argon, krypton, xenon, and radon, are used. The pre-amorphized implantation prevents subsequently doped impurities from channeling through spaces between the crystal lattice structure and reaching depths greater than desired. At least a top portion of the (polysilicon) gate electrode 16 and exposed portions of the (single crystalline) substrate 2 are changed to an amorphous state as a result of the PAI.

Referring to FIGS. 2 and 8, the method 200 proceeds to step 204 to form lightly doped source/drain (LDD) regions 20 in the substrate 2. Preferably, the LDD regions 20 are formed by implanting a p-type impurity in a PMOS device and are formed by implanting a n-type impurity in a NMOS device. The gate stack 12 acts as a mask so that the LDD regions 20 are substantially aligned with the edges of the respective gate stack 12. Halo/pocket regions (not shown) are also formed the substrate 2, preferably by implanting a n-type impurity in a PMOS device and by implanting a p-type impurity in a NMOS device.

Referring to FIGS. 3 and 8, the method 200 proceeds to step 206 by forming a gate spacer layer 22 overlying the gate stack 12 and the LDD regions 20. In the preferred embodiment, the gate spacer layer 22 includes a liner layer $22_1$ and a first spacer layer $22_2$ overlying the liner layer $22_1$. The liner layer $22_1$, for example, is silicon oxide, oxynitride, silicon nitride, silicon boron nitride, or boron nitride. The thickness of the liner layer $22_1$ is ranged from about 15 Angstroms to about 100 Angstroms. The first spacer layer $22_2$, for example, is a dielectric layer with an impurity therein, and has a relatively low dielectric constant (k) compared to dielectric layers without impurity therein. The k value of the first spacer layer $22_2$, in one embodiment, is ranged from about 4.5 to about 5.5. The liner layer $22_1$ is preferred to have stress with a type (tensile/compressive) being different from the stress type of the first spacer layer $22_2$ (compressive/tensile). In one embodiment, the first spacer layer $22_2$ is silicon nitride layer with impurity of boron, carbon, fluorine, or combinations thereof. The precursor of a deposition process for forming the silicon nitride layer includes Si-containing gas, such as $SiH_2Cl_2$, $Si_2H_6$, $SiH_4$, $Si_2Cl6$, or BTBAS, and N-containing gas, such as $NH_3$, $N_2$, or $N_2O$. The precursor of the deposition process for forming the first spacer layer $22_2$ with impurity therein further includes B-containing gas, such as $BCl_3$, BH3, or B2H6, or C-containing gas, such as $C_2H_4$ or C2H6. The flow rates of the Si-containing gas, N-containing gas, and B-containing or C-containing gas are set between about 10 to about 200 sccm, between about 500 to about 4000 sccm, and between about 20 to about 200 sccm, respectively, to modify the atomic ratio of boron or carbon ranged from about 2% to about 40%. In another embodiment, the first spacer layer $22_2$ is oxynitride layer with boron, carbon, fluorine, or combinations thereof. In another embodiment, the first spacer layer $22_2$ is silicon carbide with boron, nitrogen, fluorine, or combinations thereof. The first spacer layer $22_2$ may be formed by using commonly used techniques, such as plasma enhanced chemical vapor deposition (PECVD), low-pressure chemical vapor deposition (LPCVD), sub-atmospheric chemical vapor deposition (SACVD), atomic layer deposition (ALD), and the like. In one embodiment, the impurity is doped in the first spacer layer $22_2$ by utilizing an in-situ deposition process. In another embodiment, the impurity is doped in the first spacer layer $22_2$ by utilizing processes of deposition and ion implantation. The preferred deposition temperature is ranged between about 200° C. to about 700° C., and more preferably between about 300° C. and about 500° C. The thickness of the first spacer layer $22_2$ is ranged from about 100 Angstroms to about 400 Angstroms, and preferably ranged from about 150 Angstroms to about 300 Angstroms.

Referring to FIGS. 4 and 8, the method 200 proceeds to step 208 to pattern the gate spacer layer 22 to form gate spacers 24 adjacent to the sidewalls of the gate stack 12. The patterning may be performed by either a wet etching process, a dry etching process, or combinations thereof. Preferably, the gate spacer layer 22 is patterned by a dry etching process. More preferably, the gate spacer layer 22 is patterned by an anisotropic dry etching process. The dry etching process of the first spacer layer $22_2$, for example, is performed under the condition of (Inventor, please provide the etching recipe.). The dry etching process of the liner layer $22_1$, for example, is performed by using the gases of $CF_4$ or $CH_3F$, $O_2$, and He. The remaining portions of the liner layer $22_1$ and the first spacer layer $22_2$ thus form liners $24_1$ and first spacers $24_2$, respectively.

Referring to FIGS. 5 and 8, the method 200 proceeds to step 210 to form a second spacer layer 26 on the resulted structure shown in the FIG. 4. For example, the second spacer layer 26 is overlying the gate stack 12, the first spacers 24 and the substrate 2. The second spacer layer 26 acts as a protector to prevent the underlying first spacer portions $24_2$ from being attacked by a subsequent wet etching and/or cleaning processes. The second spacer layer 26, in one embodiment, is a dielectric layer having substantially none impurity therein. In another embodiment, the second spacer layer 26 is a dielectric layer having an amount of impurity less than the amount of impurity in the first spacer portions $24_2$ In another embodiment, the second spacer layer 26 is a dielectric layer having an amount of impurity less than about 3%. The second spacer layer 26, for example, is silicon nitride, oxynitride, silicon carbide, or the combinations thereof. The second spacer layer 26 has a dielectric constant (k) higher than the dielectric constant of the first spacer portions $24_2$, and is preferably ranged from about 5.0 to about 7.8. The second spacer layer 26 may be formed by using commonly used techniques, such as plasma enhanced chemical vapor deposition (PECVD), low-pressure chemical vapor deposition (LPCVD), sub-atmospheric chemical vapor deposition (SACVD), atomic layer deposition (ALD), and the like. The impurity is typically doped in the second spacer layer 26 by utilizing an in-situ deposition process or by deposition, ion implantation, and annealing. The preferred deposition temperature is ranged from about 200° C. to about 700° C., and more preferably between about 400° C. and about 600° C. The thickness of the second spacer layer 26 is ranged from about 50 Angstroms to about 300 Angstroms, and preferably ranged from about 100 Angstroms to about 250 Angstroms.

Figure 6:
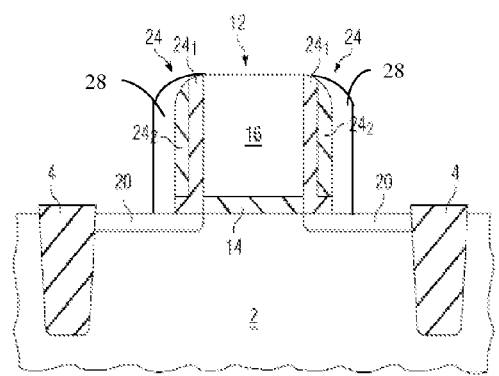

Referring to FIGS. 6 and 8, the method 200 proceeds to step 212 to pattern the second gate spacer layer 26 to form second spacers 28 adjacent to the exterior sidewalls of the first spacers $24_2$. The patterning of the second gate spacer layer 26 may be performed by either a wet etching process, a dry etching process, or combinations thereof. Preferably, the second spacer layer 26 is patterned by a dry etching process. More preferably, the second spacer layer 26 is patterned by an anisotropic dry etching process. The dry etching process of the second gate spacers 28, for example, is performed by using the gases of $CF_4$ or $CH_3F$, $O_2$, and He. The second gate spacers 28, in one embodiment, substantially compass the exterior sidewalls of the first spacers $24_2$ to prevent the first spacers $24_2$ being exposed to chemicals used in the subsequent wet processes. Hence, the second gate spacers 28 may protect the first spacers $24_2$ from being attacked by the chemicals.

Figure 7:
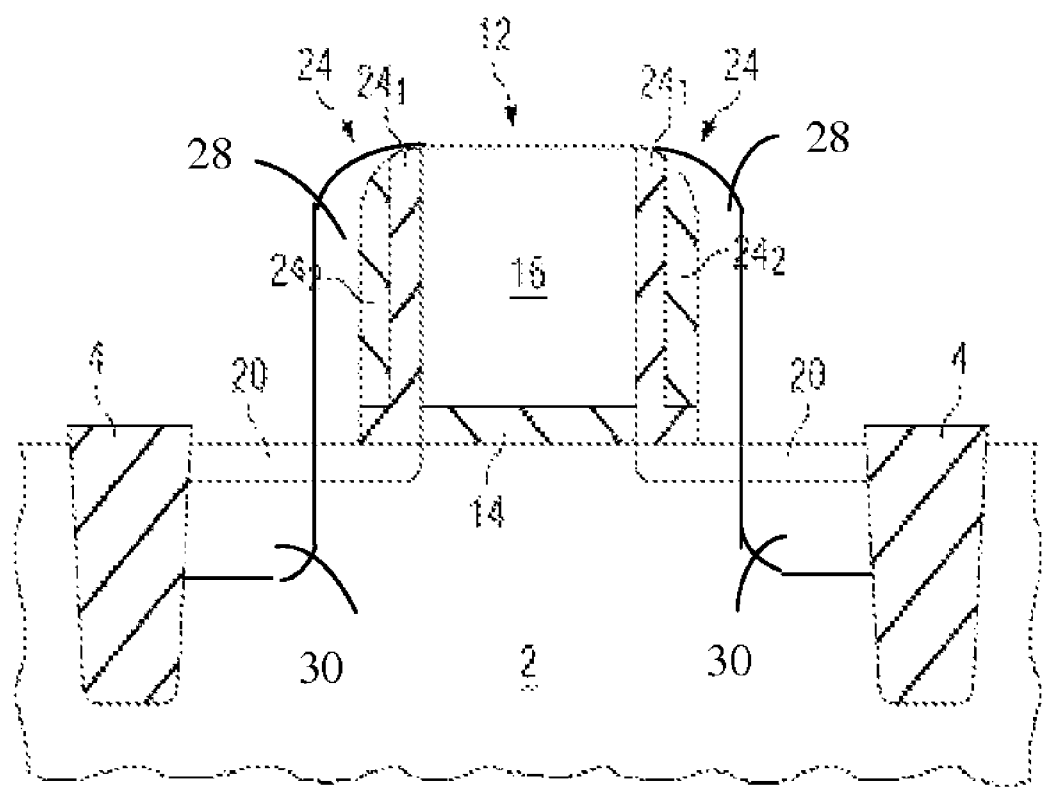

Referring to FIGS. 7 and 8, the method 200 proceeds to step 214 to form source/drain regions 30 in the substrate 2 by using the gate stack 12, the gate spacers 24, and the second gate spacers 28 as a mask. The formation of the source/drain regions 30 is preferably performed by an ion implantation or a diffusion process.

The foregoing has outlined features of several embodiments so that those skilled in the art may better understand the detailed description. Those skilled in the art should appreciate that they may readily use the present disclosure as a basis for designing or modifying other processes and structures for carrying out the same purposes and/or achieving the same advantages of the embodiments disclosed herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate having shallow trench isolation regions and source/drain regions therein;
   a gate stack overlying the substrate between the source/drain regions;
   a first spacer with a first dielectric constant overlying a sidewall of the gate stack, wherein the first spacer has an exterior sidewall; and
   a second spacer with a second dielectric constant overlying the exterior sidewall of the first spacer, wherein the first dielectric constant is less than the second dielectric constant, and wherein the first spacer has a first amount of a first impurity therein and the second spacer has a second amount of a second impurity therein, wherein the first amount is different from the second amount.

2. The semiconductor device of claim 1, further comprising a liner between the gate stack and the first spacer.

3. The semiconductor device of claim 2, wherein the liner is silicon oxide.

4. The semiconductor device of claim 1, wherein the first dielectric constant is ranged between about 4.5 to about 5.5.

5. The semiconductor device of claim 1, wherein the first spacer is at least one of silicon nitride, oxynitride or silicon carbide.

6. The semiconductor device of claim 1, wherein the second spacer is at least one of silicon nitride, oxynitride or silicon carbide.

7. The semiconductor device of claim 1, wherein the second amount is less than the first amount.

8. The semiconductor device of claim 1, wherein the first impurity and the second impurity are selected from the group consisting of boron, carbon, fluorine or combinations thereof.

9. The semiconductor device of claim 1, wherein an atomic ratio of the first impurity is ranged between about 2% to about 40%.

10. The semiconductor device of claim 1, wherein an atomic ratio of the second impurity is less than about 3%.

11. The semiconductor device of claim 1, wherein the first spacer is boron-doped nitride and the second spacer is non-doped nitride.

12. The semiconductor device of claim 1, wherein the first spacer has a thickness ranged between about 100 Angstroms to about 400 Angstroms.

13. The semiconductor device of claim 1, wherein the second spacer has a thickness ranged between about 50 Angstroms to about 300 Angstroms.

14. A MOS device comprising:
   a semiconductor substrate having shallow trench isolation (STI) regions therein;
   a gate stack overlying the semiconductor substrate between the STI regions;
   lightly doped source/drain (LDD) regions in the semiconductor substrate, wherein the LDD regions are substantially aligned respectively with the edges of the gate stack;
   a boron-doped gate spacer overlying a sidewall of the gate stack; and
   a protection spacer located overlying an exterior sidewall of the boron-doped spacer, wherein the protection spacer compass the boron-doped gate spacer.

15. The MOS device of claim 14, further comprising an oxide liner between the gate stack and the boron-doped gate spacer.

16. The MOS device of claim 14, wherein the boron-doped gate spacer has a dielectric constant ranged between about 4.5 to about 5.5.

17. The MOS device of claim 14, wherein the boron-doped gate spacer is boron-doped nitride.

18. The MOS device of claim 14, wherein the protection spacer is non-doped nitride.

19. The MOS device of claim 14, wherein the dielectric constant of the boron-doped gate spacer is less than the dielectric constant of the protection spacer.

20. A MOS device comprising:
   a semiconductor substrate having shallow trench isolation (STI) regions therein;
   a gate stack located on the semiconductor substrate between the STI regions;
   lightly doped source/drain (LDD) regions in the semiconductor substrate, wherein the LDD regions are substantially aligned respectively with the edges of the gate stack;
   oxide liners located on sidewalls of the gate stack;
   boron-doped dielectric spacers located on exterior sidewalls of the oxide liners;
   non-doped dielectric spacers located on exterior sidewalls of the boron-doped dielectric spacers, wherein the non-doped dielectric spacers compass the boron-doped dielectric spacers respectively; and
   source/drain regions in the semiconductor substrate and substantially aligned respectively with the edges of the non-doped dielectric spacers.

* * * * *